United States Patent
Martin et al.

(10) Patent No.: US 7,732,977 B2
(45) Date of Patent: Jun. 8, 2010

(54) TRANSCEIVER CIRCUIT FOR FILM BULK ACOUSTIC RESONATOR (FBAR) TRANSDUCERS

(75) Inventors: Steven Martin, Fort Collins, CO (US); Osvaldo Buccafusca, Fort Collins, CO (US)

(73) Assignee: Avago Technologies Wireless IP (Singapore), Singapore (SG)

( * ) Notice: Subject to any disclaimer, the term of this patent is extended or adjusted under 35 U.S.C. 154(b) by 0 days.

(21) Appl. No.: 12/112,669

(22) Filed: Apr. 30, 2008

(65) Prior Publication Data

US 2009/0273256 A1    Nov. 5, 2009

(51) Int. Cl.
H01L 41/04    (2006.01)
H02N 2/06    (2006.01)

(52) U.S. Cl. .................................. 310/317; 310/314

(58) Field of Classification Search ................ 310/311, 310/317, 322, 334, 335, 320, 321, 314, 315, 310/316.01, 316.02, 316.03
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandis et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |

(Continued)

FOREIGN PATENT DOCUMENTS

DE    10160617    6/2003

(Continued)

OTHER PUBLICATIONS

U.S. Appl. No. 10/971,169, filed Oct. 22, 2004, Larson III, John D., et al.

(Continued)

*Primary Examiner*—Walter Benson
*Assistant Examiner*—Derek J Rosenau

(57) ABSTRACT

A piezoelectric transducer device includes a receive signal path, a transistor and a piezoelectric transducer connected to a first terminal of the transistor. The device also includes a switch connected to a second terminal of the transistor, wherein the switch is adapted to selectively connect the second terminal of the transistor to a transmit signal or to a bias voltage; an output connected to a third terminal of the transistor, and adapted to receive a signal from the transducer when the switch is connected to the bias voltage, wherein the switch is not in the receive signal.

11 Claims, 4 Drawing Sheets

U.S. PATENT DOCUMENTS

| | | |
|---|---|---|
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | Mcclanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Boloforosh |
| 5,475,351 A | 12/1995 | Uematsu et al. |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A * | 2/1997 | Oppelt et al. ............... 600/437 |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panaski |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Elle et al. |
| 6,525,996 B1 | 2/2003 | Miyazawa |
| 6,528,344 B2 | 3/2003 | Kang |
| 6,530,515 B2 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panaski |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |

| Patent | Type | Date | Inventor |
|---|---|---|---|
| 6,594,165 | B2 | 7/2003 | Duerbaum et al. |
| 6,600,390 | B2 | 7/2003 | Frank |
| 6,601,276 | B2 | 8/2003 | Barber |
| 6,603,182 | B1 | 8/2003 | Low et al. |
| 6,617,249 | B2 | 9/2003 | Ruby et al. |
| 6,617,750 | B2 | 9/2003 | Dummermuth et al. |
| 6,617,751 | B2 | 9/2003 | Sunwoo et al. |
| 6,621,137 | B1 | 9/2003 | Ma et al. |
| 6,630,753 | B2 | 10/2003 | Malik et al. |
| 6,635,509 | B1 | 10/2003 | Ouellet |
| 6,639,872 | B1 | 10/2003 | Rein |
| 6,651,488 | B2 | 11/2003 | Larson et al. |
| 6,657,363 | B1 | 12/2003 | Aigner |
| 6,668,618 | B2 | 12/2003 | Larson et al. |
| 6,670,866 | B2 | 12/2003 | Ella et al. |
| 6,693,500 | B2 | 2/2004 | Yang et al. |
| 6,710,508 | B2 | 3/2004 | Ruby et al. |
| 6,710,681 | B2 | 3/2004 | Figueredo et al. |
| 6,713,314 | B2 | 3/2004 | Wong et al. |
| 6,714,102 | B2 | 3/2004 | Ruby et al. |
| 6,720,844 | B1 | 4/2004 | Lakin |
| 6,720,846 | B2 | 4/2004 | Iwashita et al. |
| 6,724,266 | B2 | 4/2004 | Piazza et al. |
| 6,738,267 | B1 | 5/2004 | Navas et al. |
| 6,774,746 | B2 | 8/2004 | Whatmore et al. |
| 6,777,263 | B1 | 8/2004 | Gan et al. |
| 6,787,048 | B2 | 9/2004 | Bradley et al. |
| 6,788,170 | B1 | 9/2004 | Kaitila et al. |
| 6,803,835 | B2 | 10/2004 | Frank |
| 6,812,619 | B1 | 11/2004 | Kaitila et al. |
| 6,828,713 | B2 | 12/2004 | Bradley et al. |
| 6,842,088 | B2 | 1/2005 | Yamada et al. |
| 6,842,089 | B2 | 1/2005 | Lee |
| 6,853,534 | B2 | 2/2005 | Williams |
| 6,873,065 | B2 | 3/2005 | Haigh et al. |
| 6,873,529 | B2 | 3/2005 | Ikuta |
| 6,874,211 | B2 | 4/2005 | Bradley et al. |
| 6,874,212 | B2 | 4/2005 | Larson, III |
| 6,888,424 | B2 | 5/2005 | Takeuchi et al. |
| 6,900,705 | B2 | 5/2005 | Nakamura et al. |
| 6,903,452 | B2 | 6/2005 | Ma et al. |
| 6,906,451 | B2 | 6/2005 | Yamada et al. |
| 6,911,708 | B2 | 6/2005 | Park |
| 6,917,261 | B2 | 7/2005 | Unterberger |
| 6,924,583 | B2 | 8/2005 | Lin et al. |
| 6,924,717 | B2 | 8/2005 | Ginsburg et al. |
| 6,927,651 | B2 | 8/2005 | Larson, III et al. |
| 6,936,928 | B2 | 8/2005 | Hedler et al. |
| 6,936,954 | B2 | 8/2005 | Peczalski |
| 6,943,648 | B2 | 9/2005 | Maiz et al. |
| 6,946,928 | B2 | 9/2005 | Larson et al. |
| 6,954,121 | B2 | 10/2005 | Bradley et al. |
| 6,963,257 | B2 | 11/2005 | Ella et al. |
| 6,970,365 | B2 | 11/2005 | Turchi |
| 6,975,183 | B2 | 12/2005 | Aigner et al. |
| 6,977,563 | B2 | 12/2005 | Komuro et al. |
| 6,985,052 | B2 | 1/2006 | Tikka |
| 6,987,433 | B2 | 1/2006 | Larson et al. |
| 6,989,723 | B2 | 1/2006 | Komuro et al. |
| 6,998,940 | B2 | 2/2006 | Metzger |
| 7,002,437 | B2 | 2/2006 | Takeuchi et al. |
| 7,019,604 | B2 | 3/2006 | Gotoh et al. |
| 7,019,605 | B2 | 3/2006 | Larson et al. |
| 7,026,876 | B1 | 4/2006 | Esfandiari et al. |
| 7,053,456 | B2 | 5/2006 | Matsuo |
| 7,057,476 | B2 | 6/2006 | Hwu |
| 7,057,478 | B2 | 6/2006 | Korden et al. |
| 7,064,606 | B2 | 6/2006 | Louis |
| 7,084,553 | B2 | 8/2006 | Ludwiczak |
| 7,091,649 | B2 | 8/2006 | Larson |
| 7,098,758 | B2 | 8/2006 | Wang et al. |
| 7,102,460 | B2 | 8/2006 | Schmidhammer et al. |
| 7,128,941 | B2 | 10/2006 | Lee |
| 7,138,889 | B2 | 11/2006 | Lakin |
| 7,161,448 | B2 | 1/2007 | Feng et al. |
| 7,170,215 | B2 | 1/2007 | Namba et al. |
| 7,173,504 | B2 | 2/2007 | Larson |
| 7,187,254 | B2 | 3/2007 | Su et al. |
| 7,209,374 | B2 | 4/2007 | Noro |
| 7,212,083 | B2 | 5/2007 | Inoue et al. |
| 7,212,085 | B2 | 5/2007 | Wu |
| 7,230,509 | B2 | 6/2007 | Stoemmer |
| 7,230,511 | B2 | 6/2007 | Onishi et al. |
| 7,242,270 | B2 | 7/2007 | Larson et al. |
| 7,259,498 | B2 | 8/2007 | Nakatsuka et al. |
| 7,275,292 | B2 | 10/2007 | Ruby et al. |
| 7,276,994 | B2 | 10/2007 | Takeuchi et al. |
| 7,280,007 | B2 | 10/2007 | Feng et al. |
| 7,281,304 | B2 | 10/2007 | Kim et al. |
| 7,294,919 | B2 | 11/2007 | Bai |
| 7,301,258 | B2 | 11/2007 | Tanaka |
| 7,310,861 | B2 | 12/2007 | Aigner et al. |
| 7,332,985 | B2 | 2/2008 | Larson et al. |
| 7,367,095 | B2 | 5/2008 | Larson, III et al. |
| 7,368,857 | B2 | 5/2008 | Tanaka |
| 7,388,318 | B2 | 6/2008 | Yamada et al. |
| 7,388,454 | B2 | 6/2008 | Ruby et al. |
| 7,388,455 | B2 | 6/2008 | Larson, III |
| 7,408,428 | B2 | 8/2008 | Larson, III |
| 7,414,349 | B2 | 8/2008 | Sasaki |
| 7,414,495 | B2 | 8/2008 | Iwasaki et al. |
| 7,423,503 | B2 | 9/2008 | Larson, III |
| 7,425,787 | B2 | 9/2008 | Larson, III |
| 7,439,824 | B2 | 10/2008 | Aigner |
| 7,545,532 | B2 | 6/2009 | Muramoto |
| 2002/0000646 | A1 | 1/2002 | Gooch et al. |
| 2002/0030424 | A1 | 3/2002 | Iwata |
| 2002/0063497 | A1 | 5/2002 | Panasik |
| 2002/0070463 | A1 | 6/2002 | Chang et al. |
| 2002/0121944 | A1 | 9/2002 | Larson, III et al. |
| 2002/0121945 | A1 | 9/2002 | Ruby et al. |
| 2002/0126517 | A1 | 9/2002 | Matsukawa et al. |
| 2002/0140520 | A1 | 10/2002 | Hikita et al. |
| 2002/0152803 | A1 | 10/2002 | Larson, III et al. |
| 2002/0190814 | A1 | 12/2002 | Yamada et al. |
| 2003/0001251 | A1 | 1/2003 | Cheever et al. |
| 2003/0006502 | A1 | 1/2003 | Karpman |
| 2003/0011285 | A1* | 1/2003 | Ossmann .................... 310/334 |
| 2003/0011446 | A1 | 1/2003 | Bradley |
| 2003/0051550 | A1 | 3/2003 | Nguyen et al. |
| 2003/0087469 | A1 | 5/2003 | Ma |
| 2003/0102776 | A1 | 6/2003 | Takeda et al. |
| 2003/0111439 | A1 | 6/2003 | Fetter et al. |
| 2003/0128081 | A1 | 7/2003 | Ella et al. |
| 2003/0132493 | A1 | 7/2003 | Kang et al. |
| 2003/0132809 | A1 | 7/2003 | Senthilkumar et al. |
| 2003/0141946 | A1 | 7/2003 | Ruby et al. |
| 2003/0179053 | A1 | 9/2003 | Aigner et al. |
| 2003/0205948 | A1 | 11/2003 | Lin et al. |
| 2004/0016995 | A1 | 1/2004 | Kuo et al. |
| 2004/0017130 | A1 | 1/2004 | Wang et al. |
| 2004/0056735 | A1 | 3/2004 | Nomura et al. |
| 2004/0092234 | A1 | 5/2004 | Pohjonen |
| 2004/0124952 | A1 | 7/2004 | Tikka |
| 2004/0129079 | A1 | 7/2004 | Kato et al. |
| 2004/0150293 | A1 | 8/2004 | Unterberger |
| 2004/0150296 | A1 | 8/2004 | Park et al. |
| 2004/0166603 | A1 | 8/2004 | Carley |
| 2004/0195937 | A1 | 10/2004 | Matsubara et al. |
| 2004/0212458 | A1 | 10/2004 | Lee |
| 2004/0257171 | A1 | 12/2004 | Park et al. |
| 2004/0257172 | A1 | 12/2004 | Schmidhammer et al. |
| 2004/0263287 | A1 | 12/2004 | Ginsburg et al. |
| 2005/0012716 | A1 | 1/2005 | Mikulin et al. |
| 2005/0023931 | A1 | 2/2005 | Bouche et al. |
| 2005/0030126 | A1 | 2/2005 | Inoue et al. |

| | | | | | | |
|---|---|---|---|---|---|---|
| 2005/0036604 A1 | 2/2005 | Scott et al. | | EP | 1528677 | 5/2005 |
| 2005/0057117 A1 | 3/2005 | Nakatsuka et al. | | EP | 1557945 | 7/2005 |
| 2005/0057324 A1 | 3/2005 | Onishi et al. | | EP | 1575165 | 9/2005 |
| 2005/0068124 A1 | 3/2005 | Stoemmer | | GB | 1207974 | 10/1970 |
| 2005/0093396 A1 | 5/2005 | Larson et al. | | GB | 2013343 | 8/1979 |
| 2005/0093653 A1 | 5/2005 | Larson, III | | GB | 2411239 | 8/2005 |
| 2005/0093654 A1 | 5/2005 | Larson et al. | | GB | 2418791 | 4/2006 |
| 2005/0093655 A1 | 5/2005 | Larson et al. | | JP | 61054686 | 3/1986 |
| 2005/0093657 A1 | 5/2005 | Larson et al. | | JP | 06005944 | 1/1994 |
| 2005/0093658 A1 | 5/2005 | Larson et al. | | JP | 2002/217676 | 8/2002 |
| 2005/0093659 A1 | 5/2005 | Larson et al. | | JP | 2003/124779 | 4/2003 |
| 2005/0104690 A1 | 5/2005 | Larson | | WO | WO-98/16957 | 4/1998 |
| 2005/0110598 A1 | 5/2005 | Larson, III | | WO | WO-01/06647 | 1/2001 |
| 2005/0128030 A1 | 6/2005 | Larson et al. | | WO | WO-01/99276 | 12/2001 |
| 2005/0140466 A1 | 6/2005 | Larson, III et al. | | WO | WO-02/103900 | 12/2002 |
| 2005/0167795 A1 | 8/2005 | Higashi | | WO | WO-03/030358 | 4/2003 |
| 2005/0193507 A1 | 9/2005 | Ludwiczak | | WO | WO-03/043188 | 5/2003 |
| 2005/0206271 A1 | 9/2005 | Higuchi et al. | | WO | WO-03/050950 | 6/2003 |
| 2005/0206483 A1 | 9/2005 | Pashby et al. | | WO | WO-03/058809 | 7/2003 |
| 2005/0012570 A1 | 10/2005 | Korden et al. | | WO | WO-2004/034579 | 4/2004 |
| 2005/0218488 A1 | 10/2005 | Matsuo | | WO | WO-2004/051744 | 6/2004 |
| 2006/0071736 A1 | 4/2006 | Ruby et al. | | WO | WO-2004/102688 | 11/2004 |
| 2006/0081048 A1 | 4/2006 | Mikado et al. | | WO | WO-2005/043752 | 5/2005 |
| 2006/0087199 A1 | 4/2006 | Larson et al. | | WO | WO-2005/043753 | 5/2005 |
| 2006/0103492 A1 | 5/2006 | Feng et al. | | WO | WO-2005/043756 | 5/2005 |
| 2006/0119453 A1 | 6/2006 | Fattinger et al. | | WO | WO-2003/018788 | 2/2006 |
| 2006/0125489 A1 | 6/2006 | Feucht et al. | | | | |
| 2006/0132262 A1 | 6/2006 | Fazzio et al. | | | | |
| 2006/0164183 A1 | 7/2006 | Tikka | | | | |
| 2006/0185139 A1 | 8/2006 | Larson, III et al. | | | | |
| 2006/0197411 A1 | 9/2006 | Hoen et al. | | | | |
| 2006/0238070 A1 | 10/2006 | Costa et al. | | | | |
| 2006/0284707 A1 | 12/2006 | Larson et al. | | | | |
| 2006/0290446 A1 | 12/2006 | Aigner et al. | | | | |
| 2007/0037311 A1 | 2/2007 | Izumi et al. | | | | |
| 2007/0080759 A1 | 4/2007 | Jamneala et al. | | | | |
| 2007/0085447 A1 | 4/2007 | Larson | | | | |
| 2007/0085631 A1 | 4/2007 | Larson et al. | | | | |
| 2007/0085632 A1 | 4/2007 | Larson et al. | | | | |
| 2007/0086080 A1 | 4/2007 | Larson et al. | | | | |
| 2007/0086274 A1 | 4/2007 | Nishimura et al. | | | | |
| 2007/0090892 A1 | 4/2007 | Larson | | | | |
| 2007/0170815 A1 | 7/2007 | Unkrich | | | | |
| 2007/0171002 A1 | 7/2007 | Unkrich | | | | |
| 2007/0176710 A1 | 8/2007 | Jamneala et al. | | | | |
| 2007/0205850 A1 | 9/2007 | Jamneala et al. | | | | |
| 2007/0279153 A1 | 12/2007 | Ruby | | | | |
| 2008/0055020 A1 | 3/2008 | Handtmann | | | | |
| 2008/0297279 A1 | 12/2008 | Thalhammer et al. | | | | |
| 2008/0297280 A1 | 12/2008 | Thalhammer et al. | | | | |

FOREIGN PATENT DOCUMENTS

| | | |
|---|---|---|
| EP | 0231892 | 8/1987 |
| EP | 0637875 | 2/1995 |
| EP | 0689254 | 6/1995 |
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1096259 | 5/2001 |
| EP | 1100196 | 2/2002 |
| EP | 1258990 | 11/2002 |
| EP | 1180494 | 3/2003 |
| EP | 1542362 | 6/2003 |
| EP | 1258989 | 1/2004 |
| EP | 1249932 | 3/2005 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |

OTHER PUBLICATIONS

Holzlohner, Ronald et al., "Accurate Calculation of Eye Diagrams and Bit Error Rates in Optical Transmission Systems Using Linearization", *Journal of Lightwave Technology*, vol. 20, No. 3,(Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

Navas, J. et al., "Miniaturised Battery Charger using Piezoelectric Transformers", IEEE, (2001),492-496.

Jiang, Yimin et al., "A Novel Single-Phase Power Factor Correction Scheme", *IEEE*, (1993),287-292.

Ruby, R. C., "Micro-Machined Thin Film Bulk Acoustic Resonators", *Proc. IEEE 48th, Symposium on Frequency control*, (1994),135-138.

Larson III, J. D., et al., "Measurement of Effective Kt2q,RpRs vs. Temperature for Mo/AlN/Mo Resonators", *2002 IEEE Ultrasonics Symposium*, Munich, Germany, (Oct. 2002),915-919.

Aoyama, T. et al., "Diffusion of Boron, Phosphorous, Arsenic and Antimony in Thermally Grown SiliconDioxide", *Fiujitsu Labs, J. Electromechanical Soc.*, vol. 146, No. 5, (1999),1879-1883.

Parker, T. E., et al., "Temperature-Compensated Surface Acoustic-Wave Devices with SiO2 Film Overlays", *J. Appl. Physics*, vol. 50, (1360-1369),Mar. 1979.

Tsubbouchi, K. et al., "Zero Temperature coefficient Surface Acoustic Wave Devices using Epitaxial AlN Films", *IEEE Untrasonic symposium*, San Diaego, CA, 1082, (1982),240-245.

Lakin, K. M., "Thin Film Resonators and Filters", *IEEE Untrasonics Symposium*, Caesar's Tahoe, NV, (Oct. 1999),895-906.

Lakin, K. M., et al., "Temperature Compensated Bulk Acoustic Thin Film Resonators", *IEEE Ultrasonics Symposium*, San Juan, Puerto Rico, (Oct. 2000),855-858.

Ohta, S. et al., "Temperature Characteristics of Solidly Mounted Piezoelectric Thin Film Resonators", *IEEE Ultrasonics Symposium*, Honolulu, HI, (Oct. 2003),2011-2015.

Bauer, L. O., et al., "Properties of Silicon Implanted with Boron Ions through Thermal Silicon Dioxide", *Solid State Electronics*, vol. 16, No. 3, (Mar. 1973),289-300.

Topich, J. A., et al., "Effects of Ion Implanted Flourine in Silicon Dioxide", *Nuclear Instr. And Methods, Cecon Rec*, Cleveland, OH, (May 1978),70-73.

Spangenberg, B. et al., "Dependence of the Layer Resistance of Boron Implantation in Silicon and the Annealing Conditions", *Comptus Rendus de l'Academic Bulgare des Sciences*, vol. 33, No. 3, (1980),325-327.

Hara, K. "Surface Treatment of Quartz Oscillator Plate by Ion Implantation", *Oyo Buturi*, vol. 47, No. 2,(Feb. 1978) ,145-146.

NG, J. et al., "The Diffusion Ion-Implanted Boron in Silicon Dioxide", *AIP Conf Proceedings*, No. 122, (1984),20-33.

Pang, W. et al., "High Q Single-Mode High-Tone Bulk Acoustic Resonator Integrated With Surface-Machined FBAR Filter", *Microwave Symposium Digest, IEEE MTT-S International*, (2005),413-416.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials for BAW Resonators and Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental and Theoretical Investigation on The Relationship Between AlN Properties and AlN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AlN Film Using MOCVD for 5GHx Band FBAR Filter", *2003 IEEE Ultrasonics Symposium*, (Oct. 5, 2003),pp. 170-173.

Martin, Steven J., et al., "Development of a Low Dielectric Constant Polymer for the Fabrication of Integrated Circuit Interconnect", *12 Advanced Materials*, (Dec. 23, 2000),1769-1778.

Hadimioglu, B. et al., "Polymer Films As Acoustic Matching Layers"., *1990 IEEE Ultrasonics Symposium Proceedings*, vol. 3 pp., [Previously submitted as "Polymer Files as Acoustic Matching Layers, 1990 IEEE Ultrasonics Symposium Proceeding, vol. 4 pp. 1227-1340, Dec. 1990". Considered by Examiner on Mar. 20, 2007,(Dec. 1990),1337-1340.

"Search Report from corresponding application number", GB 0605779.8, (Aug. 23, 2006).

"Examination Report from UK for application", GB 0605971.1, (Aug. 24, 2006).

"Examination report corresponding to application No.", GB0605770.7, (Aug. 25, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

Coombs, Clyde F., et al., "Electronic Instrument Handbook", *Second Edition, McGraw-Hill, Inc.*, (1995),pp. 5.1 to 5.29.

"GB Search Report for", Application No. GB0522393.8, (Jan. 9, 2006),4 pages.

"GB Search Report for Application No.", GB0525884.3, (Feb. 2, 2006),4 pgs.

Auld, B. A., "Acoustic Resonators", *Acoustic Fields and Waves in Solids, Second Edition*, vol. II, (1990),250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys. 54* (10),(Oct. 1983),5893-5910.

"Search Report from corresponding application", No. GB0605225.2, (Jun. 26, 2006).

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britain Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", *0-7803-8331-1/4/W20.00; IEEE MTT-S Digest*, (2004),927-929.

Choi, Sungjin et al., "Design of Half-Bridge Piezo-Transformer Converters in the AC Adapter Applications", *IEEE 2005*,244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Al-Ahmad, M. et al., "Piezoelectric-Based Tunable Microstrip Shunt Resonator", *Proceedings of Asia-Pacific Microwave Conference 2006*.

Lakin, K.M., "Thin Film BAW Filters for Wide Bandwidth and High Performance Applications", *IEEE Microwave Symposium Digest*; vol. 2 Jun. 6-11, 2004 , 923-926.

Lakin, et al., "Wide Bandwidth Thin Film BAW Filters", *2004 IEEE Ultrasonics Symposium*, vol. 1, Aug. 2004 ,407-410.

Sanchez, A.M. et al., "Mixed analytical and numerical design method for piezoelectric transformers", *IEEE,PESX* Jun. 2003 , 841-846.

Vasic, D et al., "A New Method to Design Piezoelectic Transformer Used in MOSFET & IGBT Drive Circuits", *IEEE 34th Annual Power Electronics Specialists Conference*, 2003 vol. 1 Jun. 15-19, 2003 , 307-312.

Vasic, D et al., "A New MOSFET & IGBT Gate Drive Insulated by A Piezoelectric Transformer", *IEEE 32nd Annual Power Electronics Specialists Conference*, 2001 vol. 3,1479-1484.

\* cited by examiner

TRANSCEIVER CIRCUIT FOR FILM BULK ACOUSTIC RESONATOR (FBAR) TRANSDUCERS

BACKGROUND

Transducers functioning at acoustic wavelengths are finding application in a variety of disparate technologies. Moreover, in many cases there is a need for comparatively small devices. These so-called miniaturized acoustic transducers generally utilize one of either a piezoelectric or a capacitive transduction mechanism. Transducers with capacitive transduction mechanisms sense a change in capacitance due to movement of one plate of a capacitor induced by a mechanical perturbation (acoustic wave). Transducers with piezoelectric transduction mechanisms sense a change in voltage due to oscillations induced by the acoustic wave.

Known piezoelectric-based transducers have clear benefits, but suffer certain drawbacks. For instance, bulk piezoelectric devices typically operate at comparatively high voltages (on the order of $10^2$ V) to transmit an appreciable acoustic output. By contrast, some FBAR acoustic transducers are designed to operate at voltages one order of magnitude lower than bulk devices (e.g., 5V). As will be appreciated, and especially in applications requiring smaller transducers, the large driving voltages are not desirable. Rather, miniaturized transducers that are readily adapted to integration with otherwise low-voltage components are desired.

While known FBAR transducers show promise in many applications, parasitic elements can impact their performance. For instance, in receive mode, the transducer and receive electronics can be modeled as a voltage divider circuit. As a result, the signal to the amplifier at the receiver can be unacceptably small, thereby significantly impacting the performance of the transducer.

What is needed, therefore, is a transducer device that addresses at least the shortcomings of known devices.

SUMMARY

In a representative embodiment a piezoelectric transducer device includes a receive signal path, a transistor and a piezoelectric transducer connected to a first terminal of the transistor. The device also includes a switch connected to a second terminal of the transistor, wherein the switch is adapted to selectively connect the second terminal of the transistor to a transmit signal or to a bias voltage; an output connected to a third terminal of the transistor, and adapted to receive a signal from the transducer when the switch is connected to the bias voltage, wherein the switch is not in the receive signal.

In another representative embodiment, a sensor includes a piezoelectric transducer device. The piezoelectric transducer device includes a receive signal path, a transistor and a piezoelectric transducer connected to a first terminal of the transistor. The device also includes a switch connected to a second terminal of the transistor, wherein the switch is adapted to selectively connect the second terminal of the transistor to a transmit signal or to a bias voltage; an output connected to a third terminal of the transistor, and adapted to receive a signal from the transducer when the switch is connected to the bias voltage, wherein the switch is not in the receive signal.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

As used herein, the terms 'a' or 'an', as used herein are defined as one or more than one.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Representative embodiments are described in the context of film bulk acoustic resonator (FBAR) transducers. As should be appreciated as the present description continues, the physical size of the transducers is beneficially comparatively small not only to foster use in smaller form-factor components, but also to reduce parasitic electrical components, such as parasitic capacitors. The transducers may be one of a variety of piezoelectric transducers. For instance, the transducers of representative embodiments may be based on those described in U.S. patent applications: "Transducers with Annular Contacts" having Ser. No. 11/604,478; and "Piezoelectric Microphones" having Ser. No. 11/588,752 to R. Shane Fazzio, et al. Still other FBAR-based transducers are contemplated. For instance, FBARs may be used to realize the transducers of the representative embodiments such as described in US Patent: commonly owned U.S. Pat. No. 7,019,605 to Bradley, et al. and U.S. Pat. Nos. 5,587,620, 5,873,153 and 6,507,583 to Ruby, et al.;" and certain features common to those described in commonly owned US Patent Publication 20070176710, to Jamneala, et al. The disclosures of this patent and patent publication are specifically incorporated herein by reference. The disclosures of these US Patents and Patent Applications are specifically incorporated herein by reference.

In addition, representative embodiments are described in sensor applications such as proximity sensors and flow-rate sensors. It is emphasized that these applications are wholly intended to be illustrative and not intended to limit the scope of the teachings. The present teachings can be implemented in a variety of applications where transducer benefits from reduced parasitics, particularly in the receive signal path. Such applications will be apparent to those skilled in the art after review of the present disclosure. Finally, the representative embodiments relate to transceiver applications. As will be appreciated, embodiments drawn only the reception of mechanical signals are contemplated. Moreover, the transmit functions and receive functions need not be combined, and separate transmitter and receiver devices are also contemplated. Rather straight-forward modifications of the device described herein will provide these variant devices.

Figure 1:
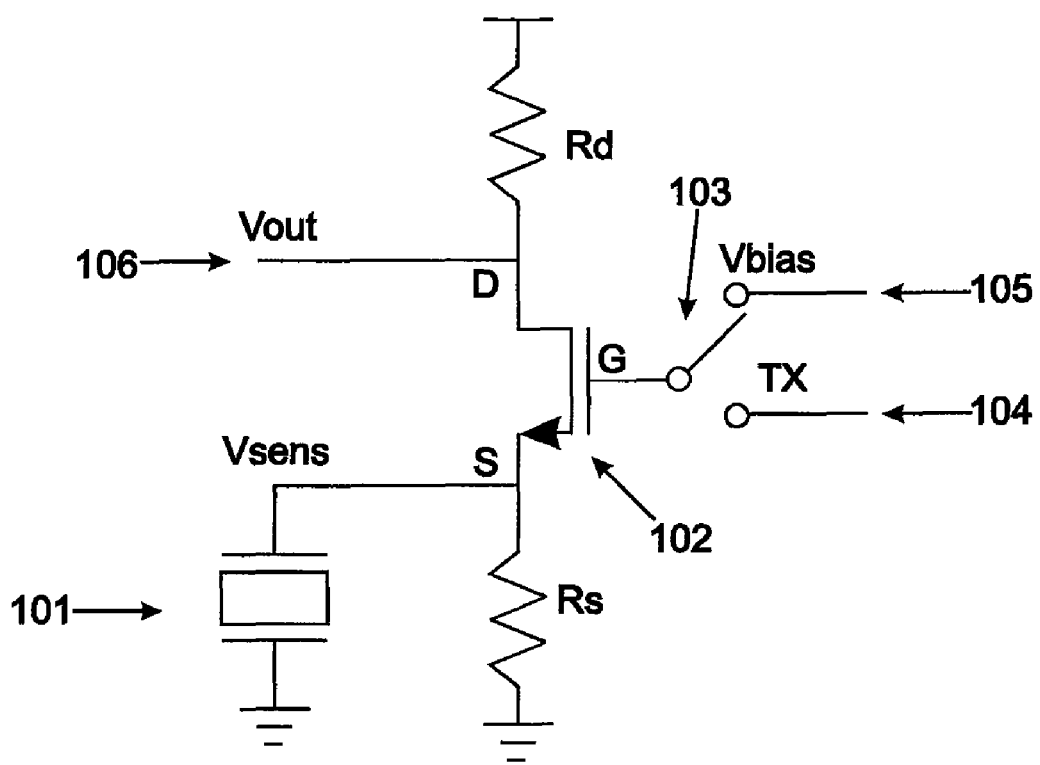
FIG. 1 is a simplified schematic diagram of a piezoelectric transducer device in accordance with a representative embodiment.

FIG. 1 is a simplified circuit diagram of a piezoelectric transducer device 100. As should be appreciated as the present description continues, the device 100 provides a transceiving function. The device 100 includes a piezoelectric transducer 101, which in a representative embodiment, is an FBAR transducer; although other types of piezoelectric transducers can be used. The transducer 101 is connected to a first terminal of a transistor 102. In a receive mode, the transducer 101 provides a voltage signal ($V_{sens}$) to the transistor 102 that is representative of an incident mechanical (e.g., acoustic) wave; and in a transmit mode receives a voltage signal from the transistor 102, converts the mechanical (acoustic) wave to an electrical wave and transmits the mechanical wave. As will become clearer as the present description continues, the device 100 provides a reduced parasitic capacitance in the receive path, which is beneficial to improving the signal-to-noise (SNR) in small signal applications.

The device 100 also includes a switch 103, which is connected to a second terminal of the transistor 102. The switch 103 may be a FET switch, or an optocoupler, or an electromechanical switch such as a MEMS switch or relay, all of which are known to those skilled in the art. The switch 103 and may be controlled by a controller (not show) operative to engage a transmit mode or a receive mode. The switch 103 is operative to connect the device 100 to a transmit signal (Tx signal) 104 or to a bias voltage ($V_{bias}$) 105. As described more fully below, when the switch 103 is connected to the Tx signal 104, the circuit operates in a transmit mode; and when the switch 103 is connected to the $V_{bias}$ 105, the device 100 operates in a receive mode.

The device 100 also includes a receive terminal 106, which is connected to a third terminal of the transistor 102. A receive voltage ($V_{receive}$), which is an amplified replica, or filtered replica, or both of $V_{sens}$, is provided at the output for further signal processing. In the representative embodiment, the transistor 102 is a field effect transistor (FET) such as a metal oxide semiconductor (MOSFET); and the first terminal is a source (S), the second terminal is a gate (G) and the third terminal is a drain (D). It is emphasized that the use of a MOSFET is illustrative and that other transistors may be used. For instance, the transistor 102 may be a bipolar transistor, or a III-V transistor such as a metal semiconductor FET (MESFET). The transistor 102 is configured to provide a gain (i.e., the transistor is part of an amplifier) to signals in a transmit path and to signals in a receive path; and thus functions as the first amplifier stage of a receiver. As such, a source resistor ($R_s$) and a drain resistor ($R_D$) are connected to the source and drain, respectively. Similar resistors are provided in bipolar and MESFET-based circuits. Notably, the source and drain resistances could be transistors. Moreover, a capacitor (or other circuit element) could be connected to the drain resistor ($R_D$) to provide filtering of the receive signal.

In operation, the switch 103 is engaged to either the transmit signal 104 or to the bias voltage 105, depending on the desired operational mode. In transmit mode, the transmit signal 104 is provided to the gate, and from the gate to the source. The transistor 102 is suitably biased so that the signal is provided to the source and to the transducer 101. The transducer 101 then converts the electrical signal to mechanical signal and emits the mechanical signal. In a receive mode, the switch 103 engages the bias voltage 105. A mechanical signal received at the transducer 101 is converted to an electrical signal, $V_{sens}$, which is provided to the source. With the transistor 102 biased by the bias voltage 105, the transistor functions as an amplification stage, and provides the signal from the source through the channel to the drain (D). The drain is connected to the receive terminal which provides the receive signal in an amplified form compared to $V_{sens}$. A significant benefit of the configuration of the device 100 is realized by the placement of the switch. As should be appreciated, when the device 100 is operating in the receive mode, the switch 103 is not in the receive signal path. As will be described more fully below, by having the switch 103 outside the receive signal path, any parasitic circuit elements (particularly parasitic capacitance) that the switch 103 may cause, can be avoided in the receive path. This ultimately, provides greater voltage signal to the receive terminal 106.

Figure 2:
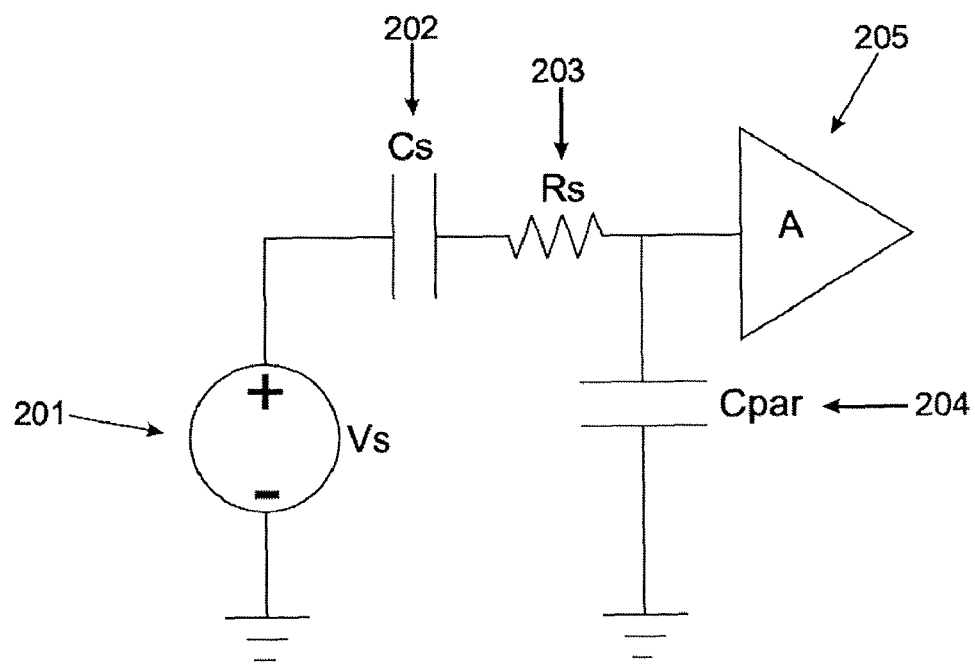
FIG. 2 is an equivalent circuit diagram of a transducer circuit in accordance with a representative embodiment.

FIG. 2 is an equivalent circuit diagram of a transducer circuit 200 in accordance with a representative embodiment. As will be appreciated, the circuit 200 models the device 100, and is described to emphasize certain benefits of the representative embodiments. The circuit 200 includes a voltage source 201 that models the piezoelectric transducer 101. The circuit 200 also includes a sense capacitance ($C_s$), which represents the capacitance of the piezoelectric transducer 101; and a series resistor $R_s$ 203, which represents the resistance of any electrical connections and any additional elements in the signal path such as a switch. The circuit includes a receive amplifier 205, which may be, for example a transistor amplifier that includes the transistor 102. The output of the amplifier 205 is the receive signal 106. Finally, the circuit 200 includes a parasitic capacitor ($C_{par}$) 204 in parallel. The parasitic capacitor 204 represents parasitic capacitance elements from various sources in the device 100; and beneficially is minimized as much as possible.

The equivalent circuit 200 is, in essence, voltage divider circuit, with a portion of a voltage signal ($V_{sens}$) from the voltage source being provided to the amplifier 205, and a portion being provided to the parasitic capacitor 204. Quantitatively, the output voltage from the amplifier is:

$$Vout = A*Cs*Vin/(Cs+Cpar+j*\omega*Cpar*Cs*Rs)$$

As will be appreciated, as Cpar increases the output signal decreases. Therefore, the greater the parasitic capacitance, the smaller the portion of the voltage signal that is provided to the amplifier 205. As should be appreciated, in transducer applications having transmit signal voltages on the order of 5V, losses to parasitic elements can deleteriously impact the receive signal provided to the amplifier. Ultimately, this can adversely impact the SNR of the receive signal. Sources of this parasitic capacitance include, but are not limited to parasitic capacitances from switches, cables and amplifiers in the receive signal path.

As will be appreciated, as Rs increases the output signal decreases. Therefore, the greater the series resistance, the smaller the portion of the voltage signal that is provided to the amplifier 205. As should be appreciated, in transducer applications having transmit signal voltages on the order of 5V, losses to parasitic elements can deleteriously impact the receive signal provided to the amplifier. Ultimately, this can adversely impact the SNR of the receive signal. Sources of this parasitic resistance include, but are not limited to parasitic resistances from switches and cables.

In the present representative embodiment, the switch 103 is provided outside the receive signal path, and as a result does not contribute to the parasitic capacitor 204 or the parasitic resistance 203. As should be appreciated, the switch 103 may be a FET switch, an optocoupler, or an electromechanical switch, and can have a comparatively large capacitance or resistance. Moreover, only one amplification stage is provided, and the small signal electrical components required in the device 100 all contribute to a reduction of the parasitic capacitor 204. As a result, compared to known transducer circuits an improved SNR is realized in a comparatively small receive signal (<5V for example) delivered to the amplifier 205. In the representative embodiments, the total parasitic capacitance ($C_{par}$) seen by the piezoelectric transducer device includes the source diffusion capacitance of the transistor, the routing capacitance, any capacitance due to Rs. The DC potential of $V_{sens}$ is set by the DC bias current flowing through the transistor and Rs. The source diffusion capacitance of the transistor can be decreased by increasing the voltage drop between the source of the transistor and the substrate.

Figure 3:
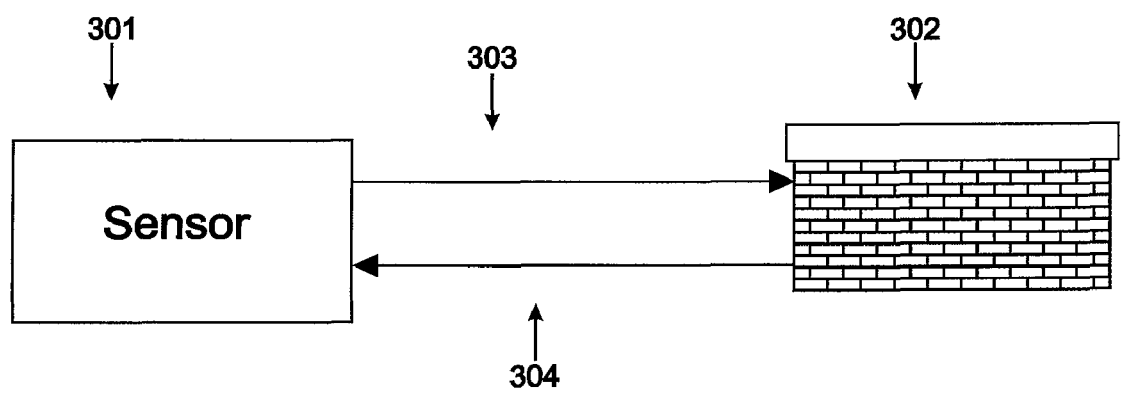
FIG. 3 is a simplified schematic diagram of a sensor in accordance with a representative embodiment.

FIG. 3 is a conceptual view of a sensor 301 in accordance with a representative embodiment. The sensor 301 is implemented as a proximity sensor in the present embodiment, and is used to determine the distance from an object 302, which is for example a wall. The sensor includes the piezoelectric transducer device 100 as well as control circuitry (not shown) for controlling, among other aspects, the selective engagement and disengagement of transmit and receive modes. In addition, the sensor may include or be connected to signal processing circuitry operative to determine a distance based on the receive signals, for example.

The sensor provides a transmit signal 303 that is incident on the object 302. The signal is reflected as receive signal 304 and is incident on the sensor 301. The piezoelectric transducer 101 creates the acoustic transmit signal and converts the acoustic receive signal 304 into an electrical signal.

Figure 4:
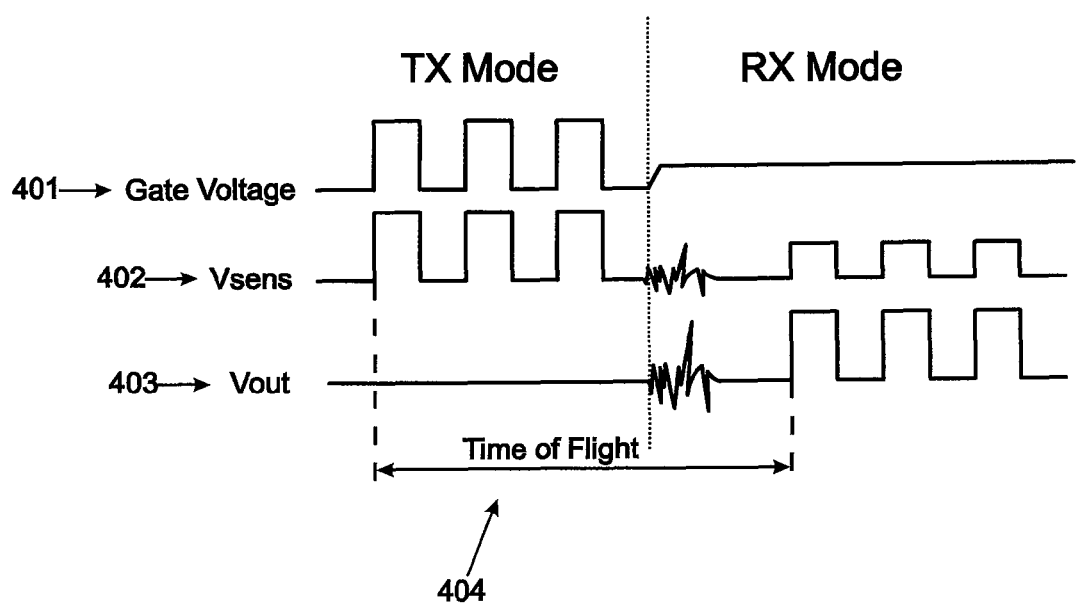
FIG. 4 is a conceptual diagram showing transmission and reception of signals in accordance with a representative embodiment.

FIG. 4 is a conceptual timing diagram of transmitted and received signals in accordance with a representative embodiment. The timing diagram is illustratively representative of the transmission and reception of mechanical signals (e.g., acoustic signals) from sensor 301 used as a proximity sensor. As such, reference is made to the embodiment of FIG. 3 generally without repetition of details.

In Tx mode, the gate voltage 401 is illustratively a square wave that is provided the transmit signal 104. $V_{sens}$ 402 is substantially equal in phase and magnitude to the gate voltage 401, and in transmit mode, the bias on the transistor 102 is such that the receive signal, $V_{rec}$, at the receive terminal 106 is substantially a constant (e.g., zero) with respect to time.

In an embodiment, transmit signal 303 is emitted from the transducer 101 after conversion Of $V_{sens}$ 402 to a mechanical wave. After transmission, the sensor 301 switches to Rx mode through the engagement of switch 103 with bias voltage 105. The transmit signal 303 is reflected from the object 302 and is incident on the sensor 301 as receive signal 304. The transducer 101 converts the receive signal 304 into an electrical signal $V_{sens}$ 402. This signal is provided to the source of transistor 102, amplified and provided at the receive terminal 106 as receive signal $V_{out}$ 403. Further processing of the receive signal can yield useful data such as the distance to the object and time of impact if the sensor or the object, or both, are moving. These data are determined from the time of flight 404.

Certain benefits are garnered from the present device and sensor. For example, the device 100 provides all the necessary functionality to use a single acoustic transducer for transmit applications, receive applications or both (transceiver applications). The device 100 reduces parasitic capacitance and resistance on the receive signal path improving signal-to-noise ratio; allows for a single design for a wide array of applications; and limits the number of noise contributing elements introduced prior to the first amplification stage. Furthermore, if desired, the device 100 could be instantiated in a NMOS-only or CMOS process that can be integrated with the transducer 101.

In view of this disclosure it is noted that the various acoustic resonator filters described herein can be implemented in a variety of materials and variant structures. Moreover, applications other than resonator filters may benefit from the present teachings. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

We claim:

1. A piezoelectric transducer device, comprising:
a receive signal path;
a transistor;
a piezoelectric transducer connected to a first terminal of the transistor;
a switch connected to a second terminal of the transistor, wherein the switch is adapted to selectively connect the second terminal of the transistor to a transmit signal or to a bias voltage; and
an output connected to a third terminal of the transistor, and adapted to receive a signal from the transducer when the switch is connected to the bias voltage, wherein the switch is not in the receive signal path.

2. A transducer device as claimed in claim 1, wherein the transistor is a field effect transistor (FET), the first terminal is a source, the second terminal is a gate and the third terminal is a drain.

3. A transducer device as claimed in claim 2, wherein the transistor is a metal oxide semiconductor field effect transistor (MOSFET).

4. A transducer device as claimed in claim 1, wherein the transistor is a bipolar transistor.

5. A transducer device as claimed in claim 1, wherein the switch is one of: an optocoupler; a field effect transistor; or an electromechanical switch.

6. A transducer device as claimed in claim 1, wherein the piezoelectric transducer is a film bulk acoustic resonator (FBAR) transducer.

7. A sensor, comprising:
piezoelectric transducer device, comprising: a transistor; a piezoelectric transducer connected to a first terminal of the transistor; a switch connected to a second terminal of the transistor, wherein the switch is adapted to selectively connect the second terminal of the transistor to a transmit signal or to a bias voltage; and an output connected to a third terminal of the transistor, and adapted to receive a signal from the transducer when the switch is connected to the bias voltage.

8. A sensor as claimed in claim 7, wherein the transistor is a field effect transistor (FET), the first terminal is a source, the second terminal is a gate and the third terminal is a drain.

9. A sensor as claimed in claim 8, wherein the transistor is a metal oxide semiconductor field effect transistor (MOSFET).

10. A sensor as claimed in claim 7, wherein the transistor is a bipolar transistor.

11. A sensor as claimed in claim 7, wherein the switch is one of: an optocoupler; a field effect transistor; or an electromechanical switch.

* * * * *